(12) United States Patent
Park et al.

(10) Patent No.: US 7,682,950 B2
(45) Date of Patent: Mar. 23, 2010

(54) METHOD OF MANUFACTURING LATERALLY CRYSTALLIZED SEMICONDUCTOR LAYER AND METHOD OF MANUFACTURING THIN FILM TRANSISTOR USING THE SAME METHOD

(75) Inventors: Kyung-bae Park, Yongin-si (KR); Kyung-yeup Kim, Yongin-si (KR); Jong-man Kim, Yongin-si (KR); Jang-yeon Kwon, Yongin-si (KR); Ji-sim Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 11/852,774

(22) Filed: Sep. 10, 2007

(65) Prior Publication Data

US 2008/0067515 A1 Mar. 20, 2008

(30) Foreign Application Priority Data

Sep. 18, 2006 (KR) .................. 10-2006-0090147

(51) Int. Cl.
*H01L 21/02* (2006.01)
(52) U.S. Cl. .................. 438/487; 257/E21.002
(58) Field of Classification Search .................. 438/166, 438/487, 799; 250/492.2, 492.22
See application file for complete search history.

(56) References Cited

U.S. PATENT DOCUMENTS

| 6,246,524 | B1 * | 6/2001 | Tanaka ................ 359/619 |
| 2004/0232432 | A1 * | 11/2004 | Sato et al. ............ 257/88 |
| 2005/0122745 | A1 * | 6/2005 | Sugiura ............... 362/626 |

* cited by examiner

*Primary Examiner*—W. David Coleman
*Assistant Examiner*—Daniel Shook
(74) *Attorney, Agent, or Firm*—Cantor Colburn LLP

(57) ABSTRACT

Provided are a method of manufacturing a laterally crystallized semiconductor layer and a method of manufacturing a thin film transistor (TFT) using the method. The method of manufacturing the laterally crystallized semiconductor layer comprises: forming a semiconductor layer on a substrate; irradiating laser beams on the semiconductor layer; splitting the laser beams using a prism sheet comprising an array of a plurality of prisms, advancing the laser beams toward the semiconductor layer to alternately form first and second areas in the semiconductor layer so as to fully melt the first areas, wherein the laser beams are irradiated onto the first areas, and the laser beams are not irradiated onto the second areas; and inducing the first areas to be laterally crystallized using the second areas as seeds.

12 Claims, 4 Drawing Sheets

METHOD OF MANUFACTURING LATERALLY CRYSTALLIZED SEMICONDUCTOR LAYER AND METHOD OF MANUFACTURING THIN FILM TRANSISTOR USING THE SAME METHOD

CROSS-REFERENCE TO RELATED PATENT APPLICATION

This application claims priority to Korean Patent Application No. 10-2006-0090147, filed on Sep. 18, 2006, and all the benefits accruing therefrom under 35 U.S.C. §119, the content of which is incorporated herein by reference in its entirety.

BACKGROUND OF THE INVENTION

1. Field of the Invention

The present invention relates to a method of crystallizing a semiconductor layer, and more specifically, to a method of manufacturing a laterally crystallized semiconductor layer having good electron mobility and good electrical characteristics using a simple, easy process.

2. Description of the Related Art

Transistors are used, for example, as switching devices in flat panel displays (FPDs), such as organic light emitting diodes (OLEDs) or liquid crystal displays (LCDs). In general, a thin film transistor (TFT) comprises a channel area, a source, and a drain formed beside both sides of the channel area, and a gate formed above the channel area.

The channel area in the TFT comprises amorphous silicon or polycrystalline silicon. Polycrystalline silicon (poly-Si) generally has higher mobility than amorphous silicon (a-Si), and thus is advantageous for operating a TFT at high-speed. Amorphous silicon may be crystallized through annealing to obtain polycrystalline silicon, and some electrical characteristics of the channel area are determined by the grain size of the polycrystalline silicon. For example, if the grain size of the polycrystalline silicon is large, the mobility of the electrons becomes greater in the channel area. Thus, some electrical characteristics of the TFT are improved.

Excimer laser annealing (ELA) has been recently used to crystallize amorphous silicon. However, increasing the grain size is limited, i.e., it is difficult to obtain a grain size of 0.5 μm or more, and it is not easy to control uniformity of the grain size.

Accordingly, crystallization methods using sequential lateral solidification (SLS), an optical phase shift mask (OPSM), a pre-patterned laser beam mask (PLBM), or the like, have been suggested. However, the crystallization methods require an apparatus for accurately adjusting substrates and multi-laser beams. Thus, it is very difficult to apply the crystallization methods to a TFT process.

SUMMARY OF THE INVENTION

In an embodiment, there is provided a method of manufacturing a laterally crystallized semiconductor layer, the method comprising: forming a semiconductor layer on a substrate; irradiating a plurality of laser beams on the semiconductor layer; splitting the laser beams using a prism sheet comprising an array of a plurality of prisms, advancing the laser beams toward the semiconductor layer to alternately form first and second areas in the semiconductor layer so as to fully melt the first areas, wherein the laser beams are irradiated onto the first areas, and the laser beams are not irradiated onto the second areas; and inducing the first areas to be laterally crystallized using the second areas as seeds.

In another embodiment, each of the prisms comprises a first slope and a second slope, which refract the irradiated laser beams in different directions.

In another embodiment, the first slopes may refract the irradiated laser beams at an angle from about 30° to about 40° clockwise from the incident directions of the irradiated laser beams.

In another embodiment, the second slopes may refract the irradiated laser beams at an angle from about 30° to about 40° counterclockwise from the incident directions of the irradiated laser beams.

In another embodiment, facing slopes of two adjacent prisms selected from the plurality of prisms may refract and transmit laser beams so that the laser beams overlap with one another in the first areas.

According to another embodiment, there is provided a method of manufacturing a TFT, the method comprising: forming a semiconductor layer on a substrate; irradiating a plurality of laser beams onto the semiconductor layer; splitting the laser beams using a prism sheet comprising an array of a plurality of prisms, advancing the laser beams toward the semiconductor layer to alternately form first and second areas in the semiconductor layer so as to fully melt the first areas, wherein the laser beams are irradiated onto the first areas, and the laser beams are not irradiated onto the second areas; inducing the first areas to be laterally crystallized using the second areas as seeds so as to form a channel area between the second areas; sequentially forming a gate insulating layer and a gate electrode on the channel area comprising at least two sides; and doping dopant ions into the second areas to form a source and a drain beside two sides of the channel area.

According to another embodiment, laser beams can be easily split using a prism sheet, and positions of areas of the semiconductor layer on which the laser beams are to be irradiated can be easily controlled in a laser annealing process for crystallizing the semiconductor layer. Thus, since it is very easy to control a position of a laterally crystallized area, semiconductor devices can be easily and uniformly manufactured. Specifically, if the laser annealing process is performed using the prism sheet, all of the laser beams can penetrate the semiconductor layer. Thus, the laser beams cannot be lost. As a result, use efficiency of the laser beams can be further improved in the laser annealing process for crystallizing the semiconductor layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
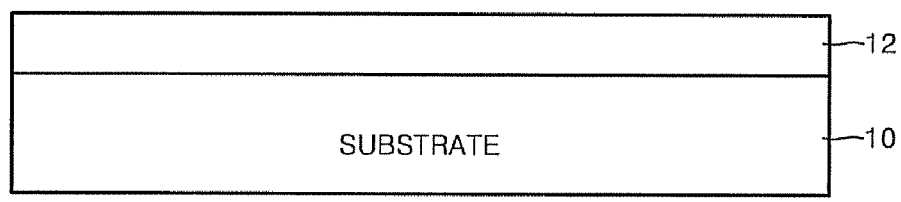
FIGS. 1A through 1C are cross-sectional views illustrating a method of manufacturing a laterally crystallized semiconductor layer according to an embodiment.

A method of manufacturing a laterally crystallized semiconductor layer and a method of manufacturing a thin film transistor (TFT) using the method will now be described in detail with reference to the accompanying drawings. In the drawings, the thickness of the layers and regions is exaggerated for clarity.

It will be understood that when an element is referred to as being "on", "beside", or "above" another element, it can be directly on, beside, or above the other element, or intervening elements may be present therebetween.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1B:
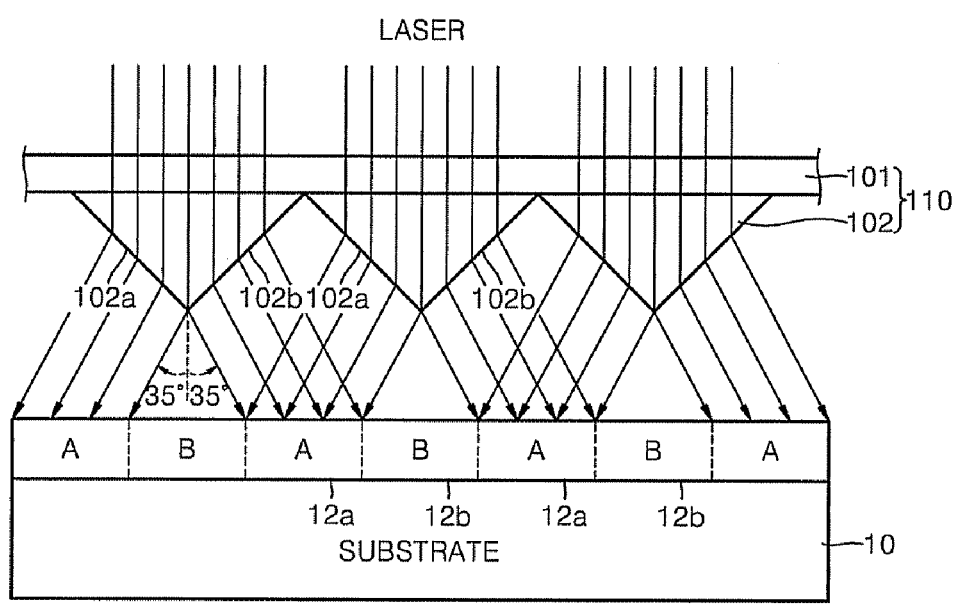
Figure 1C:
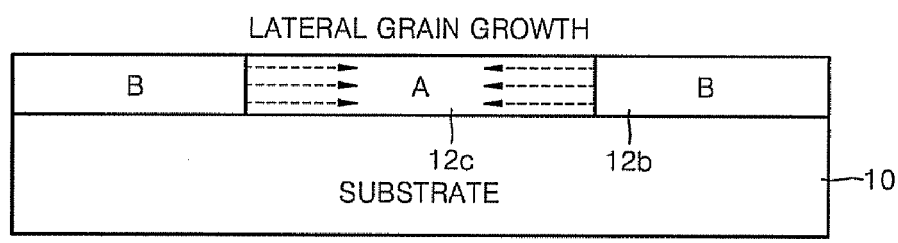

FIGS. 1A through 1C are cross-sectional views illustrating a method of manufacturing a laterally crystallized semiconductor layer according to an embodiment of the present invention. Referring to FIG. 1A, a semiconductor layer 12 is formed on a substrate 10 using a deposition method such as a chemical vapor deposition (CVD) method or a physical vapor deposition (PVD) method. The material for forming the semiconductor layer 12 is not limited. For example, the semiconductor layer 12 may be formed of silicon (Si), germanium (Ge), a compound of Si and Ge, or a group III-V semiconductor material. The semiconductor layer 12 may be formed in a crystal phase or an amorphous phase. The substrate 10 is not limited, and it may be a plastic substrate, a glass substrate, a quartz substrate, or the like.

Referring to FIGS. 1B and 1C, laser beams are irradiated on the semiconductor layer 12. The irradiated laser beams are split using a prism sheet 110 comprising a plurality of prisms 102, and advance toward the semiconductor layer 12. First and second areas 12a and 12b are alternatively formed in the semiconductor layer 12 through the splitting of the laser beams to selectively fully melt the first areas 12a. Here, the laser beams are irradiated onto the first areas 12a but not irradiated onto the second areas 12b. Lateral crystallization of the first areas 12a is induced using the second areas 12b as seeds to obtain a laterally crystallized area 12c. The induction of the lateral crystallization will now be described in detail.

The first areas 12a are fully melted but the second areas 12b are not melted or less melted than the first areas 12a in a laser annealing process. Thus, thermal gradients and solidification velocities of the first areas 12a are different from those of the second area 12b. Thus, nuclei are generated and grown at boundaries among the first and second areas 12a and 12b, and the solidification velocities of the second areas 12b are faster than those of the first areas 12a. Thus, a grain growth is directed from the boundaries among the first and second areas 12a and 12b toward centers of the first areas 12a. As a result, the laterally crystallized area 12c can be obtained.

Each of the first and second areas 12a and 12b may be formed to a width between 0.5 μm and 20 μm. The width is an appropriate numeral range for easily performing lateral crystallization. Reference characters A and B denote the first and second areas 12a and 12b, respectively.

The plurality of prisms 102 may be formed on a surface of an optical film 101 to manufacture the prism sheet 110. The shape of the prism sheet 110 and the method of manufacturing the prism sheet 110 are well known in the art, and thus the prism sheet 110 can be easily manufactured. For example, the plurality of prisms 102 may be formed in a striped pattern. Each of the prisms of the plurality of prisms 102 may include first and second slopes, 102a and 102b respectively, which refract the irradiated laser beams in different directions. The first slopes 102a refract the irradiated laser beams at an angle from about 30° to about 40° clockwise from the incident directions of the irradiated laser beams. The second slopes 102b refract the irradiated laser beams at an angle from about 30° to about 40° counterclockwise from the incident directions of the irradiated laser beams. Thus, the laser beams are split.

The facing slopes of two adjacent prisms selected from the plurality of prisms 102 refract and transmit the laser beams so that the laser beams overlap with one another in the first areas 12a. Thus, intensities of the laser beams irradiated onto the first areas 12a can be increased. Specifically, the laser beams irradiated from the second slope 102b of a first prism selected from the plurality of prisms 102 overlap with the laser beams irradiated from the first slope 102a of a second prism adjacent to the first prism. Thus, the overlapped laser beams may be irradiated onto the first areas 12a. Intensities of the laser beams irradiated on the first areas 12a can be increased using the overlapping of the laser beams to shorten a time required for melting and laterally crystallizing the first areas 12a.

The laser beams may be excimer laser beams or YAG laser beams. The excimer laser beams may be, for example, 308 nm xenon chloride (XeCl) laser beams. The semiconductor layer 12 has a high absorption coefficient with respect to these laser beams. If these laser beams are used, the semiconductor layer 12 may be easily heated.

The laser beams may be easily split using the prism sheet 110, and positions of areas of the semiconductor layer 12 onto which laser beams are irradiated may be easily controlled in a laser annealing process of crystallizing the semiconductor layer 12. Thus, since it is very easy to control a position of the laterally crystallized area 12c, semiconductor devices can be easily and uniformly manufactured. Specifically, if a laser annealing process is performed using the prism sheet 110, all of the laser beams may penetrate the semiconductor layer 12. Thus, the laser beams are not lost. Therefore, use efficiency of the laser beams can be improved in the laser annealing process for crystallizing the semiconductor layer 12 when compared to the prior art. Also, since the prism sheet 110 is very low in cost, the cost for manufacturing a semiconductor device can be lowered according to the above method.

In addition, the laterally crystallized semiconductor layer 12 may be manufactured using a simple, easy process. Since the semiconductor layer 12 is formed in a lateral grain structure having a size of 1 μm or more, the semiconductor layer 12 has good electron mobility and good electrical characteristics. Thus, if a semiconductor device such as TFT is manufactured using the laterally crystallized semiconductor layer 12, the performance of the semiconductor device can be more improved when compared to the prior art.

Figure 2:
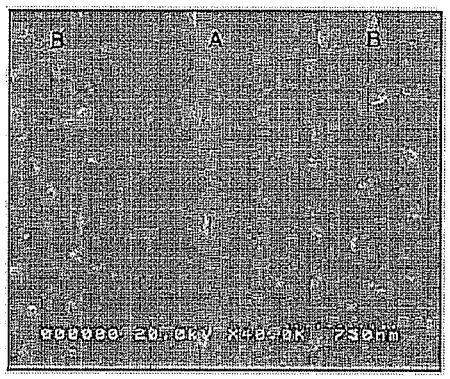
FIG. 2 is a scanning electron microscope (SEM) photograph illustrating an upper surface of the laterally crystallized semiconductor layer of FIG. 1C.

FIG. 2 is a scanning electron microscope (SEM) photograph illustrating an upper surface of the laterally crystallized semiconductor layer 12 of FIG. 1C.

Figure 3:
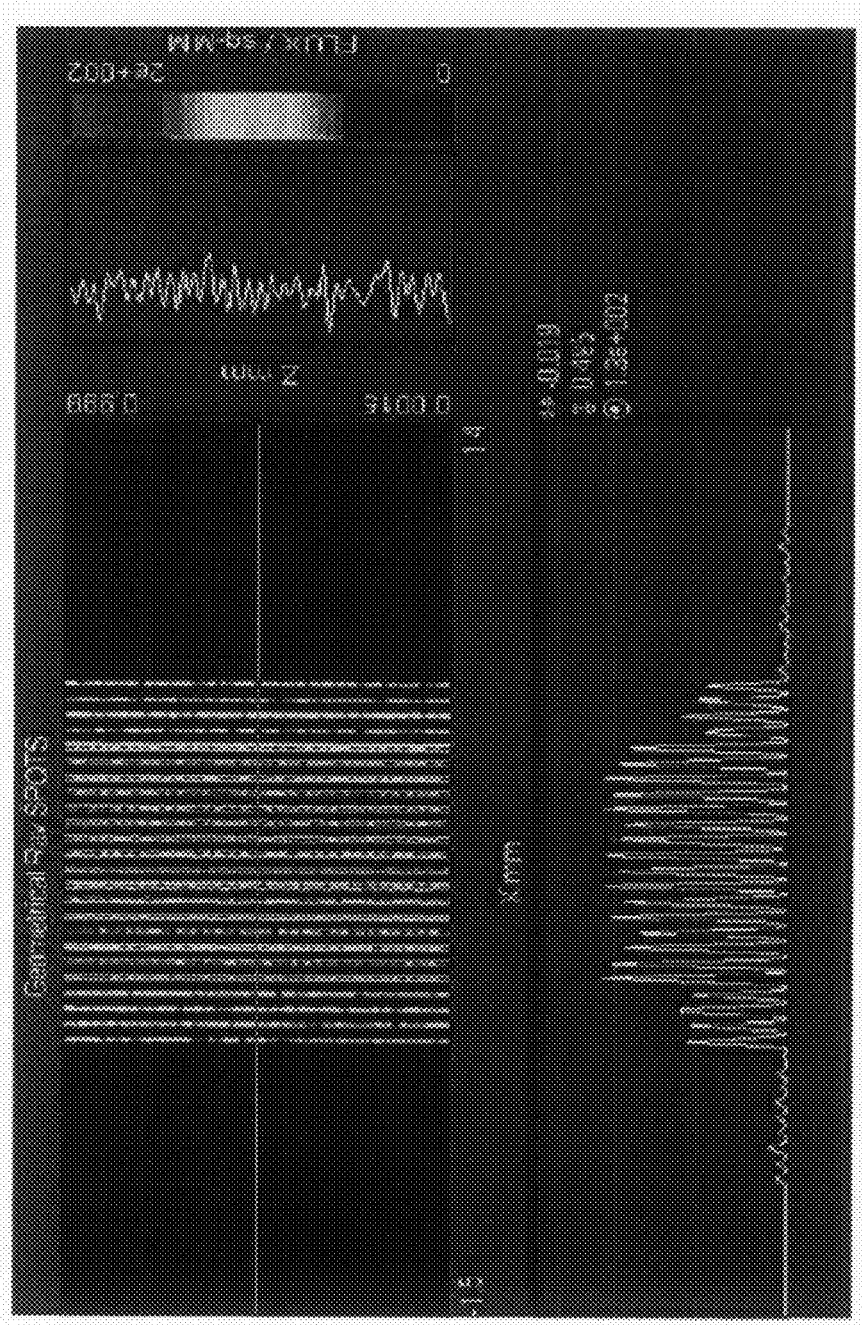
FIG. 3 illustrates results of a simulation performed on differences between laser intensities of areas of the laterally crystallized semiconductor layer of FIG. 1B on which laser beams are irradiated and areas of the laterally crystallized semiconductor layer on which laser beams are not irradiated.

FIG. 3 illustrates results of a simulation performed on differences between laser intensities of areas of the laterally crystallized semiconductor layer 12 of FIG. 1B onto which the laser beams are irradiated and areas of the laterally crystallized semiconductor layer onto which the laser beams are not irradiated.

Figure 4A:
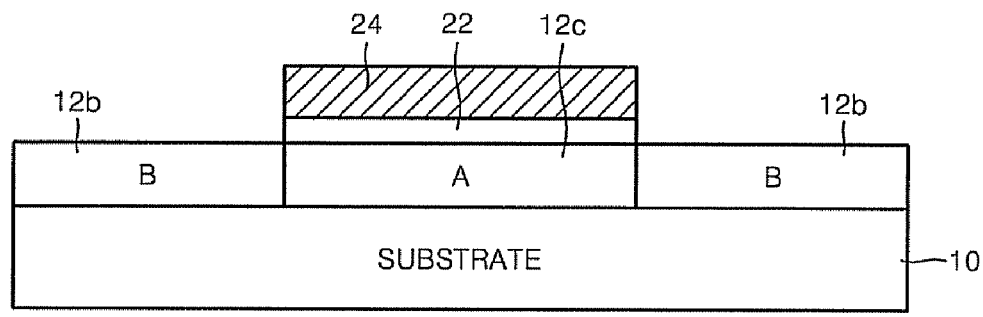
FIGS. 4A through 4C are cross-sectional views illustrating a method of manufacturing a thin film transistor (TFT) according to an embodiment.
Figure 4B:
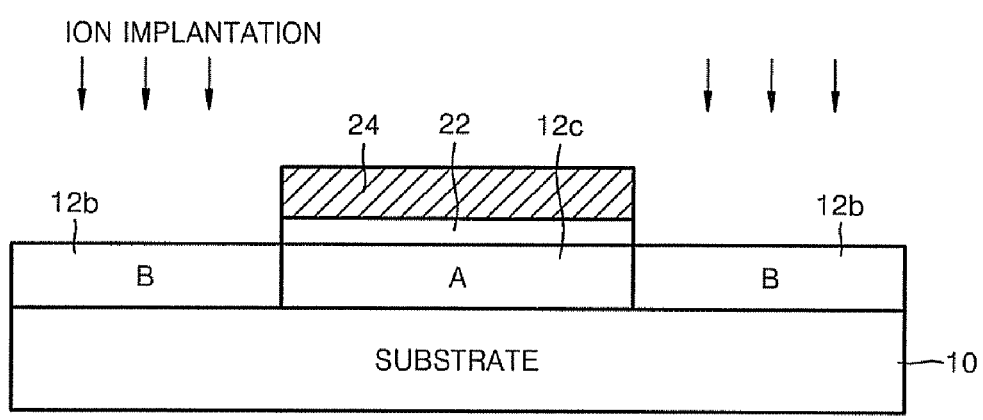
Figure 4C:
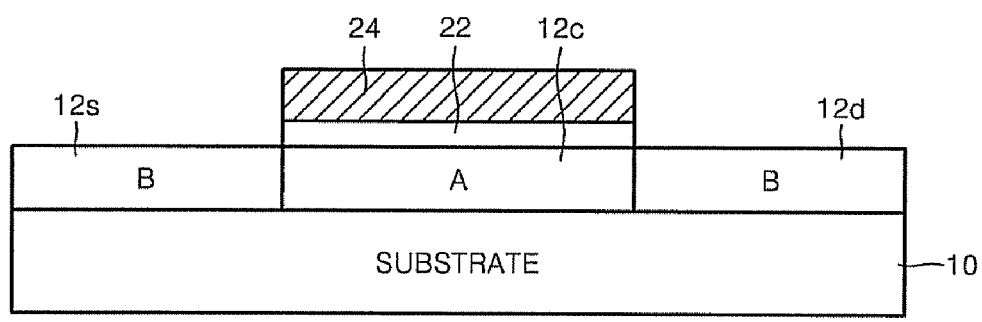

FIGS. 4A through 4C are cross-sectional views illustrating a method of manufacturing a TFT according to an embodiment.

Processes of FIGS. 4A through 4C are similar to those illustrated in reference to FIGS. 1A through 1C, and thus their repeated descriptions will be omitted herein.

Referring to FIG. 4A, a gate insulating layer 22 and a gate electrode 24 are sequentially formed in the laterally crystallized area 12c of FIG. 1C, which is referred to as a channel area in a process of manufacturing a TFT. The material and method for forming the gate insulating layer 22 are well known in the art, and thus their detailed descriptions will be omitted herein. The material and method for forming the gate electrode 24 are also well known, and thus their detailed descriptions will be omitted herein. For example, the gate insulating layer 22 may be formed of silicon dioxide ($SiO_2$) using a PVD or CVD method. The gate electrode 24 may also be formed of at least one material selected from the group consisting of nickel (Ni), aluminum (Al), platinum (Pt), gold (Au), cobalt (Co), iridium (Ir), chromium (Cr), molybdenum (Mo), tungsten (W), rhodium (Rh), or the like, or a combination comprising at least one of the foregoing materials, using a PVD or CVD method.

Referring to FIGS. 4B and 4C, dopant ions are doped into the second areas 12b positioned beside both sides of the channel area 12c to form a source 12s and a drain 12d. The dopant ions may be selected from a conductive material group consisting of p-type dopants, n-type dopants, metal ions, and the like. An ion implantation method may be suitable as a method of doping the dopant ions but is not specifically limited. Specifically, the gate electrode 24 may be used as a mask in the ion implantation process, and thus an additional mask is not required. Thus, dopant ions may be easily selectively doped into the second areas 12b, which are not covered with the gate electrode 25, without the additional mask. An excimer laser annealing (ELA) or furnace annealing process may be additionally performed after the ion implantation process in order to activate dopant ions implanted into the source 12 and the drain 12d. The ELA or furnace annealing process is well known in the art, and thus its detailed description will be omitted herein.

A laterally crystallized semiconductor layer can be manufactured using a simple, easy process. The laterally crystallized semiconductor layer can have a lateral grain structure having a size of about 1 μm or more and thus good electron mobility and good electrical characteristics. Thus, if a semiconductor device such as a TFT is manufactured using the laterally crystallized semiconductor layer, the performance of the semiconductor device can be further improved.

Also, laser beams can be easily split using a prism sheet, and positions of areas of the semiconductor layer onto which the laser beams are to be irradiated can be easily controlled in a laser annealing process for crystallizing the semiconductor layer. Thus, since it is relatively easy to control a position of a laterally crystallized area, semiconductor devices can be easily and uniformly manufactured. Specifically, if the laser annealing process is performed using the prism sheet, all of the laser beams can penetrate the semiconductor layer. Thus, the laser beams cannot be lost. As a result, use efficiency of the laser beams can be further improved in the laser annealing process for crystallizing the semiconductor layer. In addition, since the prism sheet is relatively low-priced, cost for manufacturing the semiconductor device can be lowered.

While the present invention has been specifically shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a laterally crystallized semiconductor layer, the method comprising:
    forming a semiconductor layer on a substrate;
    irradiating a plurality of laser beams on the semiconductor layer;
    splitting the laser beams using a prism sheet comprising an array of a plurality of prisms,
    advancing the laser beams toward the semiconductor layer to alternately form first and second areas in the semiconductor layer so as to fully melt the first areas, wherein the laser beams are irradiated onto the first areas, and the laser beams are not irradiated onto the second areas; and
    inducing the first areas to be laterally crystallized using the second areas as seeds.

2. The method of claim 1, wherein each of the prisms comprises a first slope and a second slope, which refract the irradiated laser beams in different directions.

3. The method of claim 2, wherein the first slopes refract the irradiated laser beams at an angle from about 30° to about 40° clockwise from the incident direction of the irradiated laser beams.

4. The method of claim 1, wherein the second areas have a width from about 0.5 μm to about 20 μm.

5. The method of claim 1, wherein the laser beams are selected from excimer laser beams and yttrium aluminum garnet (YAG) laser beams.

6. The method of claim 5, wherein the excimer laser beams are 308 nm xenon chloride (XeCl) laser beams.

7. The method of claim 3, wherein the second slopes refract the irradiated laser beams at an angle from about 30° to about 40° counterclockwise from the incident direction of the irradiated laser beams.

8. The method of claim 7, wherein facing slopes of two adjacent prisms selected from the plurality of prisms refract and transmit the laser beams so that the laser beams overlap with one another in the first areas.

9. The method of claim 1, wherein the first areas have a width from about 0.5 μm to about 20 μm.

10. A method of manufacturing a thin film transistor (TFT), the method comprising:
    forming a semiconductor layer on a substrate;
    irradiating laser beams onto the semiconductor layer;
    splitting the laser beams using a prism sheet comprising an array of a plurality of prisms,
    advancing the laser beams toward the semiconductor layer to alternately form first and second areas in the semiconductor layer so as to fully melt the first areas, wherein the laser beams are irradiated onto the first areas, and the laser beams are not irradiated onto the second areas;

inducing the first areas to be laterally crystallized using the second areas as seeds so as to form a channel area between the second areas wherein the channel area comprises at least two sides;

sequentially forming a gate insulating layer and a gate electrode on the channel area; and doping dopant ions into the second areas to form a source and a drain beside two sides of the channel area.

11. The method of claim 1, wherein the plurality of prisms are formed in a stripe pattern.

12. A thin film transistor (TFT) manufactured using the method of claim 10.

* * * * *